2/26/80 XR 4,190,784

United States Patent [19]

Massa

[11] 4,190,784

[45] Feb. 26, 1980

[54] PIEZOELECTRIC ELECTROACOUSTIC TRANSDUCERS OF THE BI-LAMINAR FLEXURAL VIBRATING TYPE

[75] Inventor: Frank Massa, Randolph, Mass.

[73] Assignee: The Stoneleigh Trust, Fred M. Dellorfano, Jr. & Donald P. Massa, Trustees, Cohasset, Mass.

[21] Appl. No.: 942,481

[22] Filed: Sep. 15, 1978

Related U.S. Application Data

[63] Continuation-in-part of Ser. No. 927,893, Jul. 25, 1978.

[51] Int. Cl.[2] .......... H01L 41/10

[52] U.S. Cl. .......... 310/324; 310/335; 179/110 A

[58] Field of Search .......... 310/322, 324, 334, 335; 179/110 A

[56] References Cited

U.S. PATENT DOCUMENTS

| | | | |
|---|---|---|---|
| 2,967,957 | 1/1961 | Massa | 310/324 |
| 3,206,558 | 9/1965 | Shoot | 310/324 X |
| 3,253,674 | 5/1966 | Desmares | 310/322 |
| 3,271,596 | 9/1966 | Brinkerhoff | 310/324 |
| 3,331,970 | 7/1967 | Dundon et al. | 310/324 |
| 3,708,702 | 1/1973 | Brunnert et al. | 310/322 |
| 3,721,840 | 3/1973 | Yamada | 310/324 X |
| 3,860,838 | 1/1975 | Kumon | 310/322 |
| 3,890,513 | 6/1975 | Barleen | 310/324 |

*Primary Examiner*—Mark O. Budd

[57] ABSTRACT

An improved transducer utilizes an acoustic delay line to adjust the phase of the acoustic output from the out-of-phase portion of a free resonant flexural disc so that it is constructively added to the acoustic output generated from the remaining portion of the resonant flexural disc. The improved transducer combines an acoustic coupler with the housing structure of the transducer for the purpose of increasing the radiation resistance load on the vibratile disc to achieve increased acoustic output from the transducer.

12 Claims, 9 Drawing Figures

PIEZOELECTRIC ELECTROACOUSTIC TRANSDUCERS OF THE BI-LAMINAR FLEXURAL VIBRATING TYPE

This invention is a continuation-in-part of the invention described in my co-pending application Ser. No. 927,893, filed 7/25/78, and is concerned with further improvements in the design of bi-laminar vibratile electroacoustic transducers which operate in the free flexural fundamental resonant mode, as described in said co-pending application.

The objects of this invention include the objects of the copending application. This invention also makes further use of the acoustic delay line described in the co-pending application to adjust the phase of the acoustic output from the out-of-phase portion of the free resonant flexural disc so that it is constructively added to the acoustic output generated from the remaining portion of the resonant flexural disc.

This invention has the additional object of further increasing the radiation efficiency of the inventive transducer by combining an acoustic coupler with the housing structure of the transducer so that the radiation resistance load on the vibratile disc is increased which results in increased acoustic output from the transducer.

A further object of this invention is to combine the oscillatory acoustic vibrations generated by the center and peripheral regions of the free resonant disc so that the acoustic vibrations from each of the regions reinforce each other.

A still further object of the invention is to simplify the construction of the inventive transducer by reducing the number of parts required for the assembly and thereby reduce the manufacturing cost.

Additional objects will become more apparent to those skilled in the art by the description of the invention which follows when taken with the accompanying drawings in which.

Figure 2:
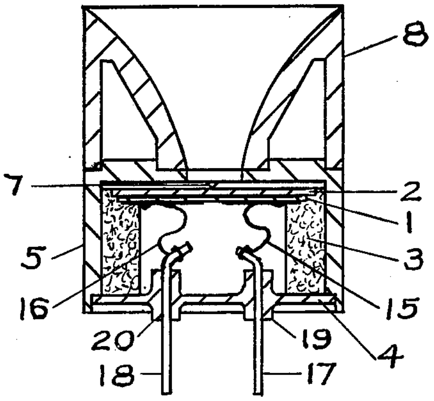
FIG. 2 is a section taken along the line 2—2 of FIG. 1.
Figure 5:
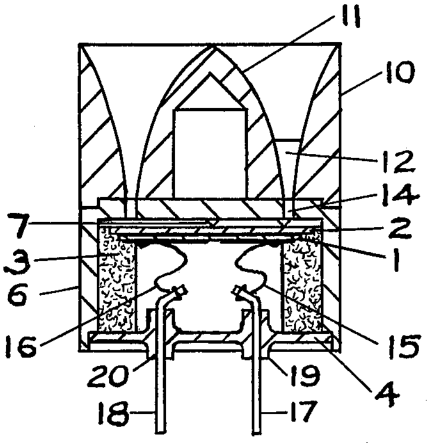
FIG. 5 is a section taken along the line 5—5 of FIG. 4.
Figure 7:
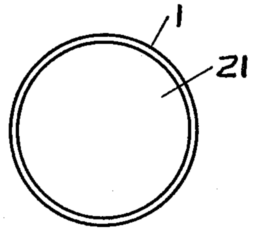
FIG. 7 is a top plan view of a preferred type of polarized ceramic disc used in the bi-laminar vibratile disc assembly.

Referring more particularly to the figures, a bi-laminar vibratile disc assembly is illustrated in FIGS. 2 and 5 which is similar to the bi-laminar vibratile disc assembly shown in FIG. 7 of the co-pending application. The bi-laminar disc assembly comprises a polarized ceramic disc 1 which is bonded with a rigid cement such as epoxy, as is well known in the art, to a disc member 2.

The disc member 2 may be of light-weight aluminum alloy such as has been generally used in the design of vibratile bi-laminar transducer elements. A disadvantage sometimes results from the use of aluminum because of its relatively high coefficient of thermal expansion as compared with the polarized ceramic which may cause thermal induced stresses in the bonded ceramic which will vary as a function of temperature and introduce variations in the piezoelectric characteristics of the ceramic which, for critical applications, may become undesirable. The thermally induced stress variation is generally more pronounced with some of the lead-zirconate-titanate materials which use additives for increasing the dielectric constant and at the same time reduces the Curie point of the piezoelectric material. To reduce the magnitude of the thermal stress variations that occur with aluminum, I have found it advantageous to substitute for the aluminum disc a material having a lower coefficient of thermal expansion. A particularly good material for use in making the disc 2 is alumina which is a ceramic obtained by firing aluminum oxide which has approximately $\frac{1}{4}$ the coefficient of thermal expansion of aluminum. Alumina has a modulus of elasticity which is about four times the modulus of elasticity of aluminum metal, which means that a thinner disc of alumina may be used as a replacement for the aluminum disc for the same resonant frequency of the assembly.

The bi-laminar disc assembly 1, 2 is supported by a flexible foam rubber ring 3 which is compressed slightly when the terminal plate 4 is seated into the recessed rim portion of the housing member 5 or housing member 6. The radiating surface of the vibratile disc 2 is spaced from the flat surface of the housing 5 or housing 6 by the three conical spacers 7 which are preferably equally spaced on a diameter equal to the nodal diameter of the vibratile disc 2 when it is vibrating in its fundamental free resonant frequency mode. Except for the three conical spacers 7, the vibratile structure of FIG. 2 is the same as the structure shown in FIG. 7 of my co-pending application. In order to increase the radiation efficiency of the transducer shown in FIG. 2, an acoustic coupler 8 is provided as an extension of the housing 5. The housing is preferably made of molded plastic and is provided with a recessed surface for locating the acoustic coupler 8, as illustrated in FIG. 2. The acoustic coupler 8 may be cemented or ultrasonically welded to the housing 5 using conventional procedures well known in the art.

If the acoustic coupler 8 is to be used for high frequencies above 10 kHz, a tiny structure $\frac{1}{2}$" to 1" long and in which the axial opening is flared at a rate in which the diameter doubles at intervals of approximately $\frac{1}{4}$" to $\frac{1}{2}$" along the axis will behave as an infinite exponential horn, and will improve the acoustic loading on the vibratile disc 2, so that for a given amplitude of vibration of the disc 2, the acoustic power radiated from transducer will be increased. The use of the acoustic coupler will also serve to interface the transducer with a directional baffle such as a conical horn if it is desired to confine the acoustic radiation to a narrow beam.

During the operation of the transducer illustrated in FIG. 2, the out-of-phase vibrations generated by the outer peripheral area of the disc 2 are delayed in travelling the distance from the periphery of the disc 2 to the center opening in the housing member 5. If the diameter of the disc 2 and hole diameter in housing 5 are selected so that the radial distance from the periphery of the hole in housing 5 to the periphery of the disc 2 lies in the range $\frac{1}{4}$ to $\frac{3}{4}$ wavelength of the sound at the operating frequency of the transducer, the out-of-phase vibrations generated by the peripheral area of the disc 2 will be phase-shifted to enhance the vibrations generated by the center area of the disc 2. A more complete discussion of the operation of the acoustic delay line in the inventive transducer is given in the Specification of my co-pending application, which is made part of this application by reference.

Figure 1:
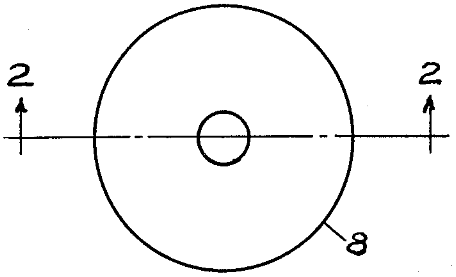
FIG. 1 is a plan view looking at the top of one embodiment of the inventive assembly.
Figure 4:
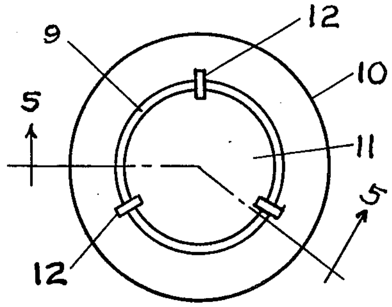
FIG. 4 is a plan view looking at the top of another embodiment of the inventive transducer assembly.
Figure 3:
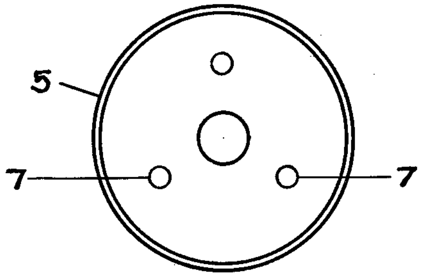
FIG. 3 is a bottom view of the transducer illustrated in FIGS. 1 and 2 showing only the housing structure with the innerportion of the transducer assembly removed.
Figure 6:
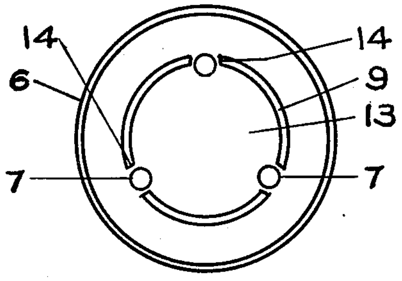
FIG. 6 is a bottom view of the transducer illustrated in FIGS. 4 and 5 showing only the housing structure with the inner portion of the transducer assembly removed.

FIGS. 4, 5, and 6 illustrate an alternate design of the transducer construction shown in FIGS. 1, 2, and 3. The bi-laminar vibratile disc assembly comprising the polarized ceramic 1 and the disc 2 in FIG. 5 is identical to the bi-laminar disc assembly illustrated in FIG. 2. The foam rubber supporting structure 3 and the conical spacers 7 are also identical to the same elements illustrated in FIG. 2. The only difference in the construction of FIG. 5 is that the housing 6 is provided with an annular opening 9 to replace the center circular opening shown in FIG. 2. The annular opening 9 is dimensioned with its inner diameter approximately equal to the nodal diameter of the vibratile disc 2 when the disc is vibrating in its free fundamental resonant mode. The acoustic coupler comprises an outer portion 10 and an inner portion 11, as illustrated. The inner and outer portions of the acoustic coupler are held in spaced relationship by the three tapered webs 12 which are molded integrally with the molded acoustic coupler portions 10 and 11. The center circular portion 13 of the housing 6 is held in place by the three spacer portions 14 which are molded integrally with the molded plastic housing. The three conical spacers 7 are molded to project from the flat surfaces of the spacer portions 14, as shown in FIG. 6.

In order to complete the assembly of the transducer, the flexible conductors 15 and 16 are soldered to the electrode surfaces of the ceramic 1 and to the terminal leads 17 and 18 in the conventional manner. The terminal leads 17 and 18 are located in position in the tight-fitting holes provided in the bushings 19 and 20 which are molded integrally with the terminal plate 4, as illustrated in FIGS. 2 and 5. After the flexible leads 15 and 16 are soldered to the leads 17 and 18, the terminal plate 4 is either cemented to the recessed portion of the housing into which it fits, or the overhanging lip of the housing is rolled over the edge of the terminal plate 4 to secure the assembly.

Figure 8:
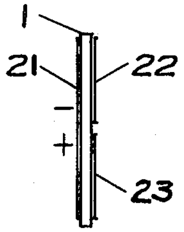
FIG. 8 is a side view of the ceramic disc of FIG. 7.
Figure 9:
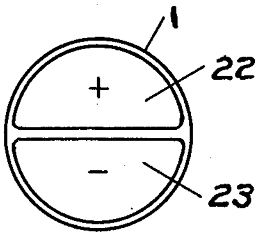
FIG. 9 is a bottom plan view of the polarized ceramic disc illustrated in FIGS. 7 and 8.

In order to make it more convenient to make electrical connection to the ceramic element, it is preferable to use the split electrode configuration illustrated in FIGS. 7, 8, and 9. One side of the ceramic disc is provided with a single metallic electrode 21, and the opposite side is provided with two separated electrodes 22 and 23, as illustrated. When the ceramic is Polarized, the positive (+) polarizing potential is applied to one of the split electrodes 22, and the negative (−) polarizing potential is applied to the other split electrode 23. The center tap from the polarizing potential is applied to the circular electrode 21. This type of polarization brings both terminal connections from the ceramic disc on the same side of the disc and perm its the convenient attachment of the two leads 15 and 16, as illustrated in FIGS. 2 and 5.

A more complete description of the principle of operation of the split electrode construction may be found in U.S. Pat. No. 3,128,532, dated Apr. 14, 1964. FIG. 10 in the reference patent shows the wiring diagram for applying the polarization potential to the split electrode ceramic.

While a few specific embodiments of the present invention have been shown and described, it should be noted that various additional modifications and alternative constructions may be made without departing from the true spirit and scope of the invention. Therefore, the appended claims are intended to cover all such equivalent alternate constructions that fall within their true spirit and scope.

I claim:

1. In combination in an electroacoustic transducer, a flexurally vibratile plate assembly comprising a plurality of bonded plates at least one of which is capable of changing its lateral dimensions upon being subjected to the influence of an electrical signal, support means for supporting said vibratile plate assembly, said support means characterized in that it does not significantly impede the free flexural displacement of the vibratile plate assembly when it is operated at its fundamental free flexural resonant mode of vibration, said vibratile plate assembly characterized in that when it is operating at its fundamental free resonant frequency mode, the displacement of the peripheral area of the vibrating surface of said vibratile plate assembly is of opposite phase compared with the displacement of the central area of said vibratile plate assembly, a cup-shaped housing structure having a closed bottom portion and an axially-aligned open end portion, said housing structure adapted for enclosing said vibratile plate assembly, said support means characterized in that it holds said vibratile plate assembly in axial alignment with said housing structure when it is enclosed in said housing, a lid, means for attaching said lid to said open end of said housing structure whereby to close said open end, said lid characterized in that it has an opening, and further characterized in that said opening is concentric with the axis of said cup-shaped housing when said lid is attached to close said housing, spacing means for locating the vibratile surface of said vibratile plate assembly in close spaced proximity to the inner wall surface of said lid when said lid is attached to said housing structure, said spacing means characterized in that the total contact area of said spacing means is negligibly small compared with the surface area of said vibratile disc, said spacing means further characterized in that it includes at least three separate small surfaces located in a plane perpendicular to the axis of said cup-shaped housing, said spacing means further characterized in that the central axis of said vibratile plate assembly is held in alignment with the central axis of said housing structure, said opening in said lid further characterized in that the area of the opening does not exceed 50% of the total area of said vibratile plate assembly, said lid further characterized in that the radial dimension between the outer peripheral edge of the opening in said lid and the outer peripheral edge of said closely spaced vibratile plate assembly is greater than approximately $\frac{1}{4}$ wavelength and less than approximately $\frac{3}{4}$ wavelength of the sound in the medium at the frequency of operation whereby said lid acts as an acoustic delay line for reversing the out-of-phase acoustic vibrations generated by the outer peripheral area of the vibratile disc before they reach the opening in said lid whereby the delayed peripheral vibrations add constructively to the vibrations generated by the central area of said vibratile disc.

2. In combination in an electroacoustic transducer, a flexurally vibratile disc assembly comprising a plurality of bonded discs at least one of which is a piezoelectric material which has the property of changing its radial dimension when a voltage is applied across the opposite surfaces of said piezoelectric disc, support means for supporting said vibratile disc assembly, said support means characterized in that it does not significantly impede the free flexural displacement of the peripheral edge of said vibratile disc assembly when it is vibrating at its fundamental free flexural mode, said vibratile disc assembly characterized in that when it is operating at its fundamental free resonant frequency mode of vibration, the displacement of the peripheral area of the vibratile surface of said vibratile disc assembly is of opposite phase compared with the displacement of the central area of the vibratile surface of said vibratile disc assembly, a cup-shaped housing structure adapted for enclosing said vibratile disc assembly, said support means characterized in that it holds said vibratile disc assembly in axial alignment with said housing structure when it is enclosed in said housing, a lid, means for attaching said lid to said open end of said housing structure whereby to close said open end, said lid characterized in that it has an opening, and further characterized in that said opening is concentric with the axis of said cup-shaped housing when said lid is attached to close said housing, spacing means for locating said vibratile disc assembly in spaced close proximity to the inner wall surface of said lid when said lid is attached to said housing structure, said spacing means further characterized in that the total contact area of said spacing means is negligibly small compared with the surface area of said vibratile disc, said lid characterized in that the area of the opening in said lid does not exceed 50% of the area of the vibratile disc assembly, said lid further characterized in that the radial dimension between the outer peripheral edge of the opening in said lid and the outer peripheral edge of said closely spaced vibratile disc is greater than $\frac{1}{4}$ wavelength and less than $\frac{3}{4}$ wavelength of the sound generated by said vibratile disc at the frequency of operation whereby said lid acts as an acoustic delay line for reversing the out-of-phase acoustic vibrations generated by the outer peripheral area of the vibratile disc before they reach the opening in said lid whereby the delayed peripheral vibrations add constructively to the vibrations generated by the central area of said vibratile disc.

3. The invention in claim 2 characterized in that said spacing means includes three tiny projections from the inner bottom surface of said cup-shaped housing structure, and further characterized in that the tips of the said projections make contact with the surface of said vibratile disc assembly and serve as locating points for accurately spacing the surface of said vibratile disc assembly from the inner surface of said lid.

4. The invention in claim 3 further characterized in that the position of the three tiny projections are located on a circle whose diameter is approximately equal to the nodal diameter of the vibratile disc when it is operating at its fundamental free resonant frequency mode of vibration.

5. The invention in claim 2 and an acoustic coupler having a flared axial opening, means for attaching said acoustic coupler to said hosing structure with the small area of the flared axial opening located in alignment with the opening in said housing structure.

6. The invention in claim 5 characterized in that said flexural fundamental resonant frequency of said vibratile disc assembly is above 10 kHz, and further characterized in that the axial length of said acoustic coupler is less than 1 inch, and still further characterized in that the area of the flared axial opening in said acoustic coupler is quadrupled for each $\frac{1}{4}''$ to $\frac{3}{4}''$ increase along the axis of said acoustic coupler.

7. The invention in claim 6 characterized in that said flared axial opening is circular in cross section.

8. The invention in claim 7 characterized in that said flared axial opening is an annulus in cross section.

9. The invention in claim 8 characterized in that the small end of said flared annular opening is located near the nodal diameter of said vibratile disc, and further characterized in that the inside diameter of said annular opening is not less than the nodal diameter of the vibratile disc.

10. The invention in claim 2 characterized in that said spacing means includes three tiny areas located in a fixed position relative to the inside surface of said cup-shaped housing, said three tiny areas further characterized in that their positions are equidistant from the axis of said housing, and still further characterized in that said tiny areas lie in a plane perpendicular to the axis of said housing.

11. The invention in claim 10 characterized in that the said tiny areas include resilient rubber-like surfaces, and further characterized in that said resilient surfaces make contact with the surface of said vibratile disc when said vibratile disc is mounted within said housing structure.

12. The invention in claim 11 further characterized in that said resilient contact surfaces are located near the nodal diameter of said vibratile disc assembly.

* * * * *